United States Patent [19]

Kurihara

[11] Patent Number: 5,126,959
[45] Date of Patent: Jun. 30, 1992

[54] CODE GENERATION CONTROL DEVICE

[75] Inventor: Takao Kurihara, Tokyo, Japan

[73] Assignee: Clarion Co., Ltd., Tokyo, Japan

[21] Appl. No.: 614,922

[22] Filed: Nov. 16, 1990

[30] Foreign Application Priority Data

Nov. 20, 1989 [JP] Japan .................. 1-301481

[51] Int. Cl.⁵ .......................... G06F 1/02; H04J 13/00
[52] U.S. Cl. ....................................... 364/717; 377/33
[58] Field of Search ................... 364/717; 377/33, 26; 370/18

[56] References Cited

U.S. PATENT DOCUMENTS

| | | | |
|---|---|---|---|
| 4,785,410 | 11/1988 | Hamatsu et al. | 364/717 |
| 4,845,726 | 7/1989 | Kurihara et al. | 377/33 |
| 4,912,666 | 3/1990 | Harada | 364/717 |
| 4,945,537 | 7/1990 | Harada | 364/717 |
| 5,062,121 | 10/1991 | Kurihara et al. | 364/717 |

*Primary Examiner*—David H. Malzahn
*Attorney, Agent, or Firm*—Flynn, Thiel, Boutell & Tanis

[57] ABSTRACT

A code generation control device is disclosed, which is provided with circuits indicated in following items (a) to (d) in order to set initial information for generating codes in a plurality of PNGs:

(a) a strobe pulse generating section, which outputs a strobe pulse, every time the initial information is set in one PNG;

(b) a counting section, which counts the output of (a) on the basis of the number of PNGs, in which the initial information is set;

(c) a decoder section, which decodes the count value of (b) and chip-selects one of the plurality of PNGs; and (d) a control section, which outputs a strobe pulse to each of the PNGs and a code chip number counting section on the basis of a code switching control signal at that time on the basis of a signal outputted by (b), when the count value reaches a predetermined number of PNGs, in which the initial information is set, and the strobe pulse outputted by (a).

2 Claims, 14 Drawing Sheets

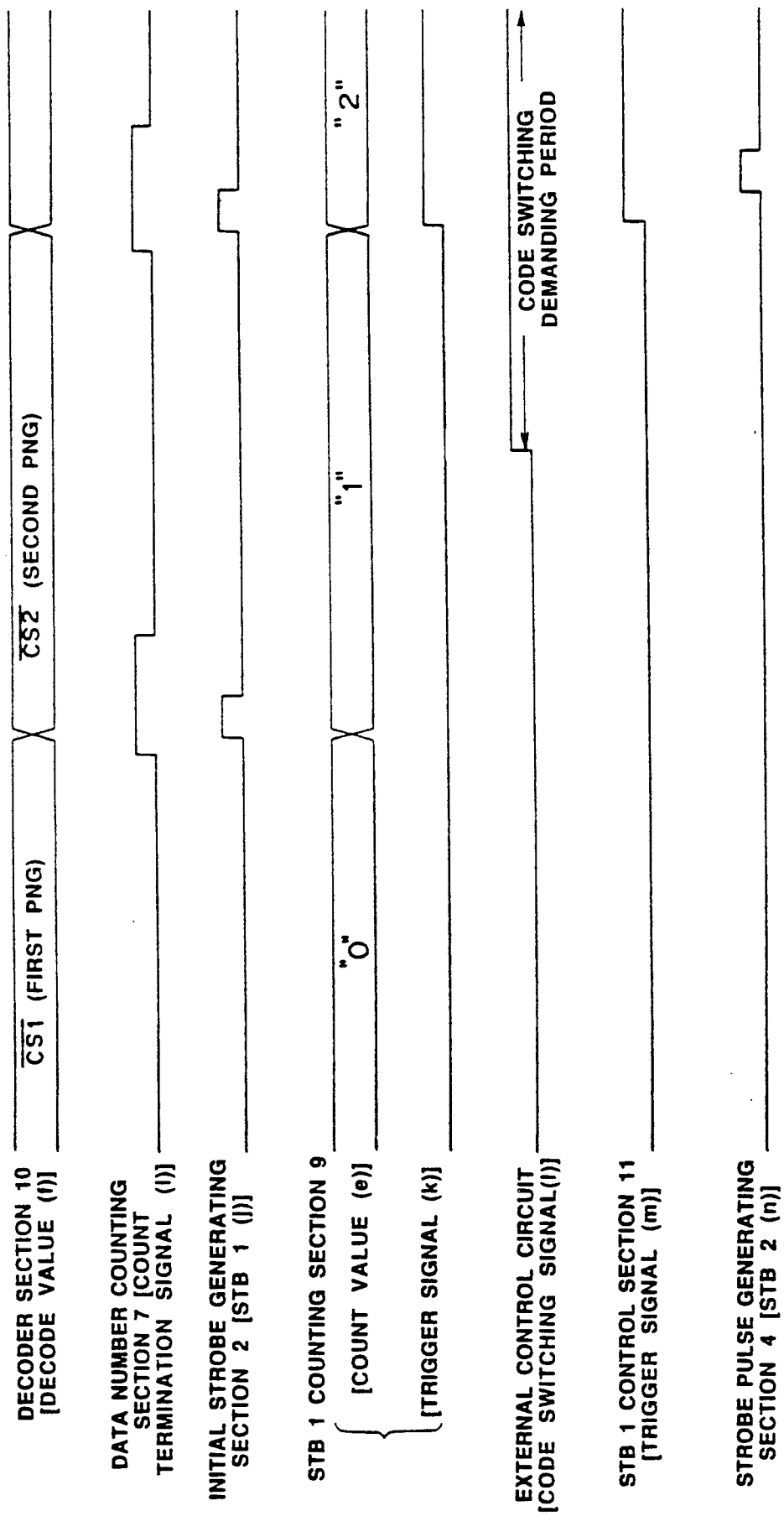

CODE GENERATION CONTROL DEVICE

FIELD OF THE INVENTION

The present invention relates to a device controlling generation of codes of digital data.

BACKGROUND OF THE INVENTION

As a prior art system there is known a pseudo noise generator (hereinbelow abbreviated to PNG) disclosed in Japanese patent application No. 60-122071 (JP-P-61-280135A) filed Jun. 5, 1985 which corresponds to U.S. Pat. No. 4,785,410, issued Nov. 15, 1988.

However the PNG stated above has the following drawbacks.

(1) Since the setting of initial information for generating codes in the PNG is effected by a software using a microprocessor, the time required for the setting is determined by the processing speed of the microprocessor and therefore a system, in which the tolerated setting time is limited, is unsuitable.

(2) In a system using a plurality of PNGs the period, during which the setting of the initial information is effected in the PNGs, is long, which lowers the utilization efficiency of the microprocessor.

(3) In particular, in the case where a plurality of PNGs are used in a communication system, inconveniences are produced such that the setting of the initial information by using only a microprocessor for effecting frequently communication utilizing different codes for transmission and reception gives rise to a difficulty in the real time property of the communication, etc.

As means for solving the items (1) and (2) described above there is known that disclosed e.g. in JP-P-63-18836A, which corresponds to U.S. Pat. No. 4,845,726 issued Jul. 4, 1989. That means comprises a memory, in which the initial information for generating a maximum length linearly recurring sequence code (hereinbelow called simply M sequence code) is stored; an M sequence code generator; a control device for setting the initial information necessary for generating the M sequence code from the memory to the M sequence code generator stated above; and an external control circuit for setting a number of chips defining the heading address of the memory and the M sequence code in the control device described above and the object thereof is to control one PNG. FIG. 6 is a block diagram indicating the construction thereof. Consequently, even if the means described above is used, it is difficult to remove the inconvenience indicated in the item (3) described previously. In FIG. 6, reference numeral 31 is the control device; 32 is the memory; and 33 is the M sequence code generator.

OBJECT OF THE INVENTION

The object of the present invention is to provide a circuit system capable of effecting the setting of the initial information for generating codes in a plurality of PNGs with a high speed.

An example of the PNGs, which is the object of the present invention, is a PNG as indicated in FIG. 3.

SUMMARY OF THE INVENTION

In order to achieve the above object, a code generation control device according to a first invention of the present application, which consists of a memory, in which initial information for generating an M sequence code is stored; a plurality of pseudo noise code generators; a control device for setting initial information necessary for generating codes from the memory to the plurality of pseudo noise code generators described above; and an external control circuit for setting the heading address of the memory and the number of the pseudo noise code generators; characterized in that the control device described above comprises a data number counting section, which counts the number of initial information sets for generating codes, when a clock signal is inputted therein, and outputs a termination signal on the basis of the termination of the data number counting; an address counting section, which can specify an address in the memory on the basis of an inputted clock signal and set the heading address described above; a counter control section, which puts the data number counting section and the address counting section in the enable state on the basis of a counter load signal from the external control circuit; an initial strobe signal generating section for generating a first strobe signal on the basis of the termination signal stated above; a strobe signal counting section, in which a count value corresponding to the number of the pseudo noise code generators is set by the external control circuit, and which outputs the count value on the basis of the first strobe signal and at the same time outputs a trigger signal, when the count value reaches a predetermined value; a decoder section, which decodes the count value of the strobe signal counting section and chip-selects one of the plurality of pseudo noise code generators; and a strobe signal generating means, which generates a second strobe signal to the plurality of pseudo noise code generators on the basis of the trigger signal described above.

Further a code generation control device according to a second invention of the present application is characterized in that the strobe signal generating section in the device according to the first invention, in which a code switching control signal is inputted further from the external control circuit, generates the second strobe signal on the basis of the state of the code switching control signal stated above, corresponding to the input of the trigger signal.

In order to set the initial information for generating codes in a plurality of PNGs, the number of PNGs, in which the initial information is set, is counted. The count value is decoded, until the count value reaches a value previously set, and one of the plurality of PNGs is chip-selected.

BRIEF DESCRIPTION OF THE DRAWINGS

FIGS. 2A, 2B and 2C are timing charts for explaining the operation of the device indicated in FIG. 1;

DETAILED DESCRIPTION

Figure 1:
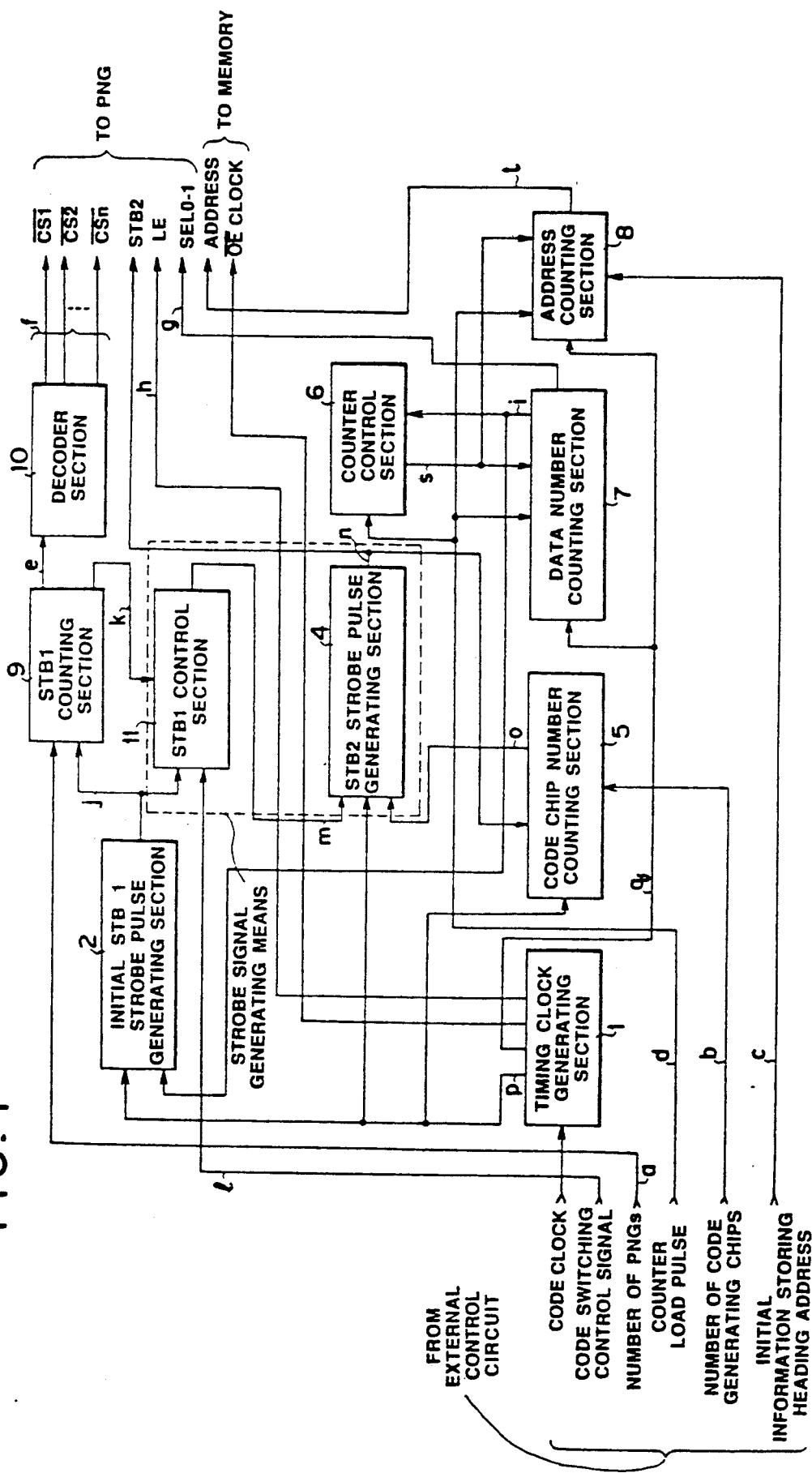
FIGS. 1, 7 and 8 are block diagrams indicating the construction of the control device used in different code generation control devices according to the present invention.

FIG. 1 is a block diagram indicating the construction of the control device used in a code generation control device stated later according to the present invention. In the figure, reference numeral 1 is a timing clock generating section for blocks 2 to 8 described later synchronized with a clock pulse supplied to the control device; 2 is a strobe pulse generating section operated after the setting of the initial information for generating codes; 4 is a strobe pulse generating section operated after the termination of the count of the code chip number set in a code chip number counting section 5; 5 is the code chip number counting section, in which the code chip number can be set; 6 is a counter control section putting a data number counting section 7 and an address counting section 8 in the enable state or the disable state; 7 is the data number counting section counting the number of initial information sets for generating codes; 8 is the address counting section, in which the heading address of the memory storing the initial information for generating codes can be set; 9 is an STB1 counting section counting the number of generations of the initial strobe pulse STB1; 10 is a decoder section decoding the value counted by the STB1 counting section 9; and 11 is an STB1 control section gate-controlling the initial strobe pulse STB1. It is an external control circuit (e.g. a microprocessor) that sets the number of PNGs, the number of code chips, the heading address and the counter load pulse.

Hereinbelow the operation of the control device described above will be explained.

After the power-on and reset and before the starting of the device indicated in FIG. 1, the external control device should set the number of PNGs (a) in the STB1 counting section 9, the number of code chips (b) in the code chip number counting section 5, and the heading address (c) of the memory storing the initial information necessary for generating codes in the address counting section 8.

Figure 3:
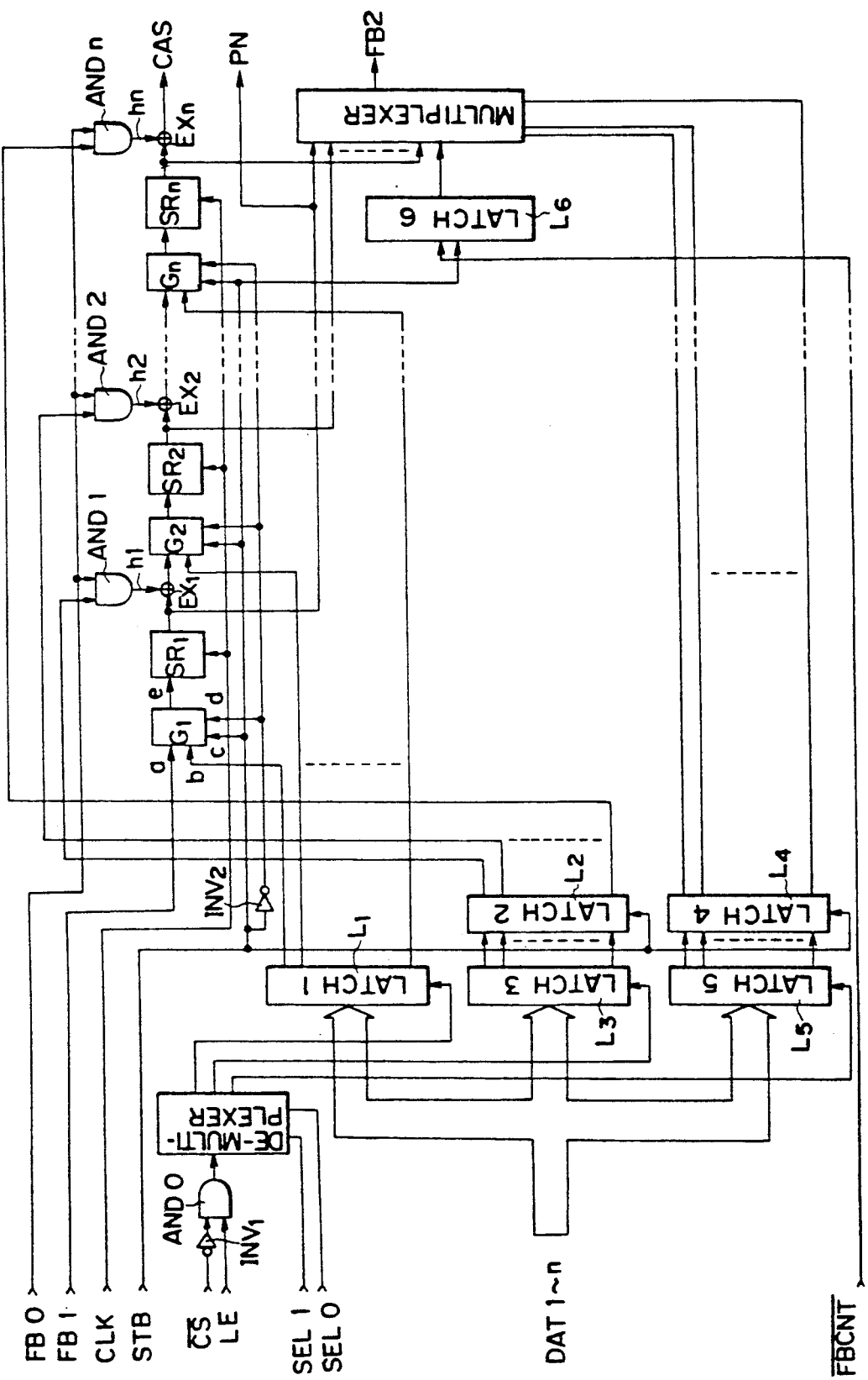
FIGS. 3, 9 to 12 show different examples of the PNG, which are objects of the present invention.

FIG. 3 is a block diagram showing an example of the pseudo noise code generator (PNG), which is an object of the present invention. As initial information necessary for generating codes in the code generating device as indicated in FIG. 3 there are the following information (i) to (iii);

(i) the initial state of the shift register;
(ii) the feedback state, and
(iii) the last stage selection state for the shift register In FIG. 3, $G_1$ to $G_n$ are steering gates; $AND_0$ to $AND_n$ are AND gates; $SR_1$ to $SR_n$ are flipflops; $EX_1$ to $EX_n$ are exclusive logic sum circuits; $L_1$ to $L_6$ are latch circuits; $INV_1$ and $INV_2$ are inverter circuits; DE-MPX is a demultiplexer; MPX is a multiplexer; CLK is a supplied clock; STB is a code switching strobe; $\overline{CS}$ is a chip select; LE is a latch enable signal; DAT 1 to n are the data (i) to (iii) as stated above; SEL 0 to 1 are data selects, which select the data (i) to (iii) e.g. as indicated in TABLE 1; FB 0 to 1 and CAS are the input and the output terminals for the cascade connection, respectively; FB2 is a three state output; and PN is a code output.

TABLE 1

| SEL 1 | SEL 0 | DATA |
|---|---|---|
| L | L | (i) |
| L | H | (ii) |
| H | L | (iii) |

TABLE 1-continued

| SEL 1 | SEL 0 | DATA |
|---|---|---|
| H | H | Meaningless |

Figure 2A:
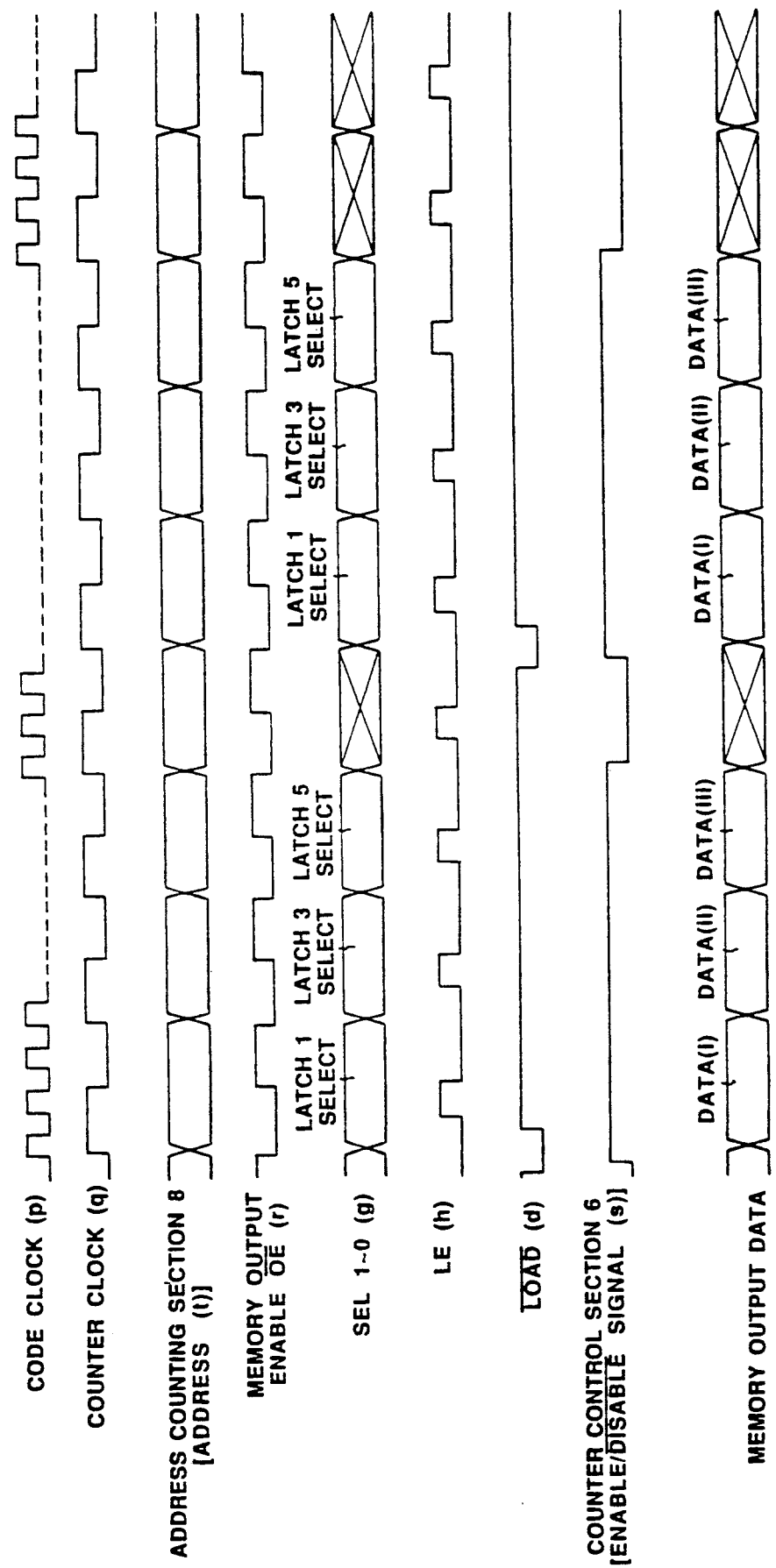
Figure 2C:
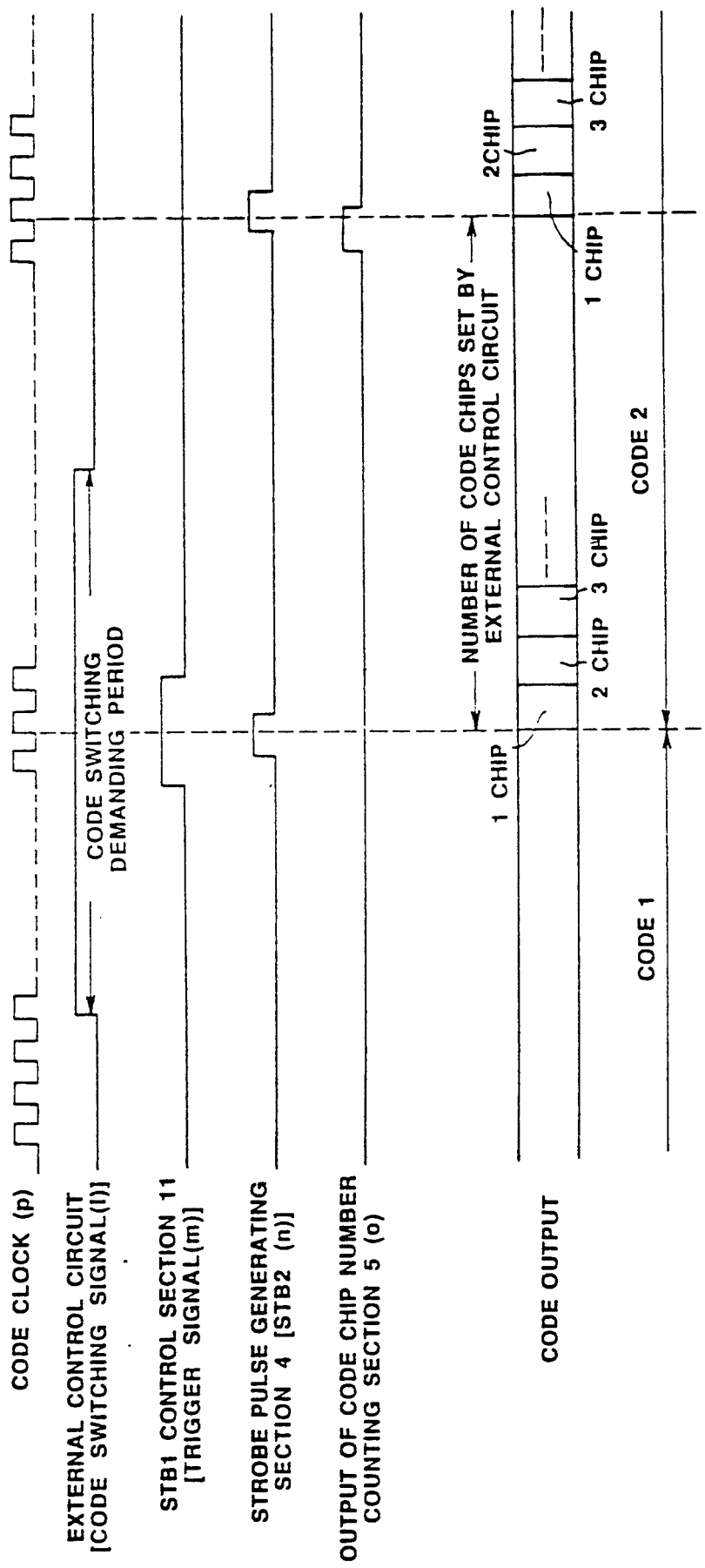
Figure 4:
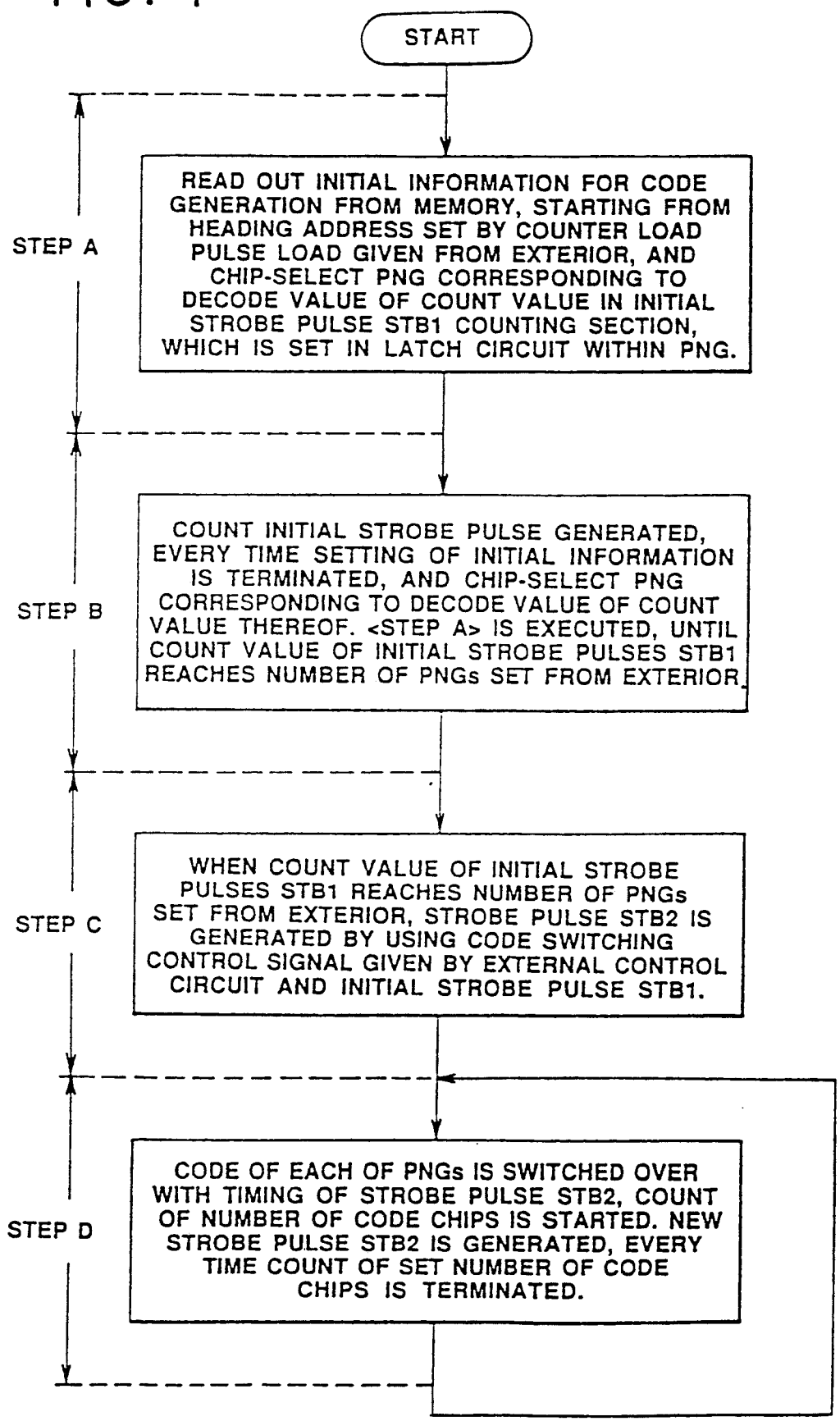
FIG. 4 is a flow chart indicating the operation of the device indicated in FIG. 1.

FIGS. 2A, 2B and 2C are timing charts for explaining the operation of the device indicated in FIG. 1, in the case where the number of PNGs is 2. On the other hand, FIG. 4 is a flowchart for explaining the operation of the device indicated in FIG. 1. The external control circuit gives the counter control section 6, the data number counting section 7 and the address counting section 8 in FIG. 1 a counter load pulse LOAD (d) after having set the heading address (c) of the memory.

The counter control section 6 in FIG. 1 puts the data number counting section 7 and the address counting section 8 in the enable state by using this counter load pulse LOAD (d) as a trigger. The address counting section 8 in FIG. 1 accesses the memory, starting from the heading address previously set and reads out successively the data (i) to (iii) described above.

Next the decoder section 10 decodes the value (e) outputted from the STB1 counting section 9 and chip-selects (f) the PNG corresponding to the decode value. The latch enable pulse LE (h) generated by the data number counting section 7 is controlled by the demultiplexer SEL 0 to 1 (g) and sets successively the data (i) to (iii) in the latch circuit of the code generating device as indicated in FIG. 3 (FIG. 4 <STEP A>).

Further, the data number counting section 7 counts the counter clock inputted in the address counter section 8, i.e. counts the data (i) to (iii). After the termination of the count, it sends a count termination signal (i) to the counter control section 6, which sends a count control signal (s) to the data number counting section 7 and the address counting section 8 to put them in the disable state. The signal (i) of the count termination for the number of the date (i) to (iii) generated by the data number counting section 7 is sent also to the initial strobe generating section 2 and the initial strobe generating section 2 generates a strobe pulse STB1 (j) by using this signal as a trigger.

The STB1 counting section 9 counts the number of generations of the strobe pulse STB1 (j) generated by the initial strobe generating section 2 on the basis of the number of PNGs (a) set by the external control circuit. The decoder section 10 decodes the value (e) counted by the STB1 counting section 9 and chip-selects (f) the PNG corresponding to the decoded value (FIG. 4 <STEP B>).

When the counted value reaches the number of PNGs (a) set by the external control circuit, the STB1 counting section 9 outputs a trigger signal (k) to the STB1 control section 11. The STB1 control section 11 outputs a trigger signal (m) to the strobe pulse generating section 4 on the basis of a code switching control signal (l) given by the external control circuit and the strobe pulse STB1 (j) at that time. The strobe pulse generating section 4 outputs a strobe pulse STB2 (n) to each of the PNGs and the code chip number counting section 5 (FIG. 4 <STEP C>).

Figure 7:
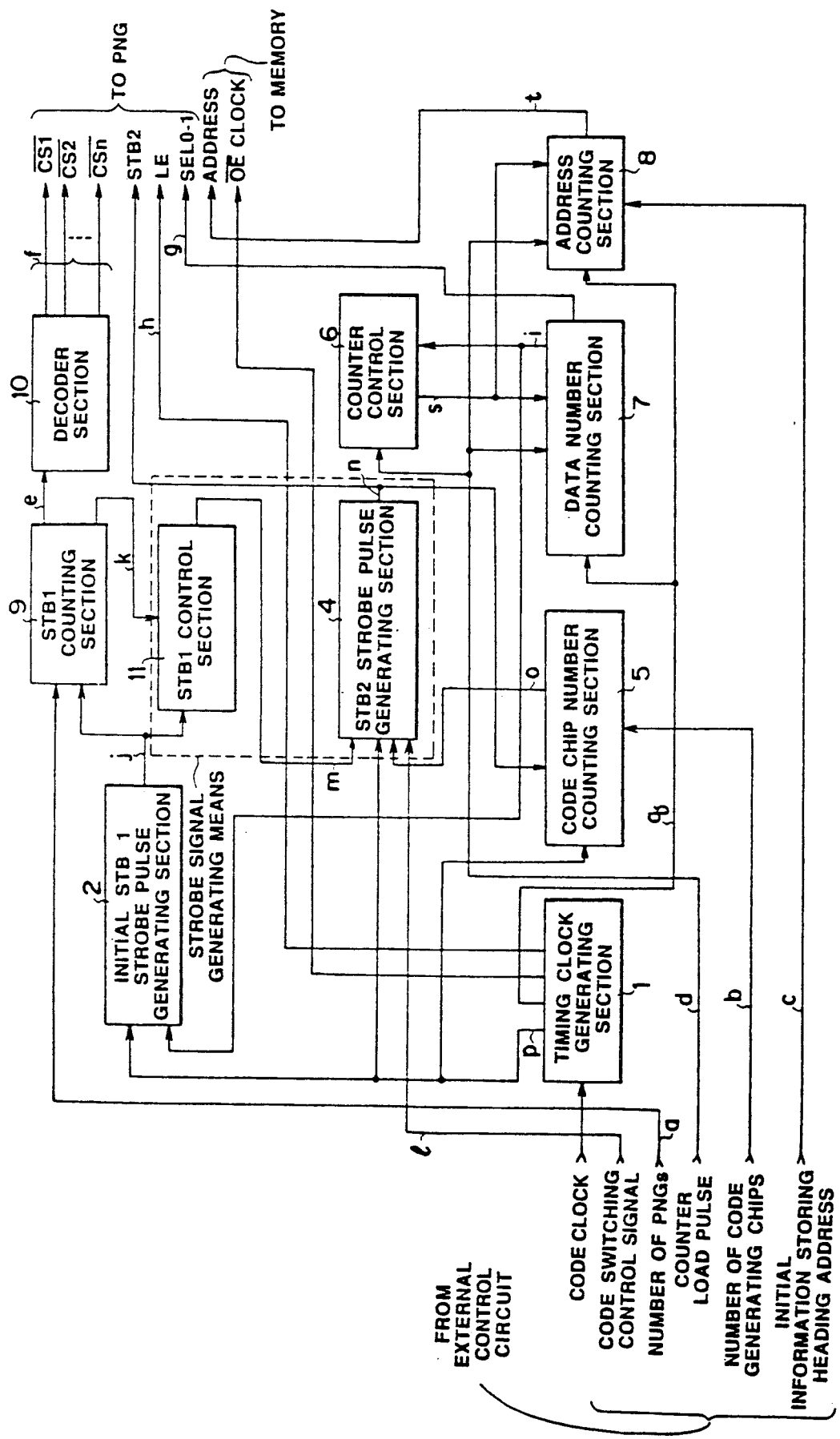
Figure 8:
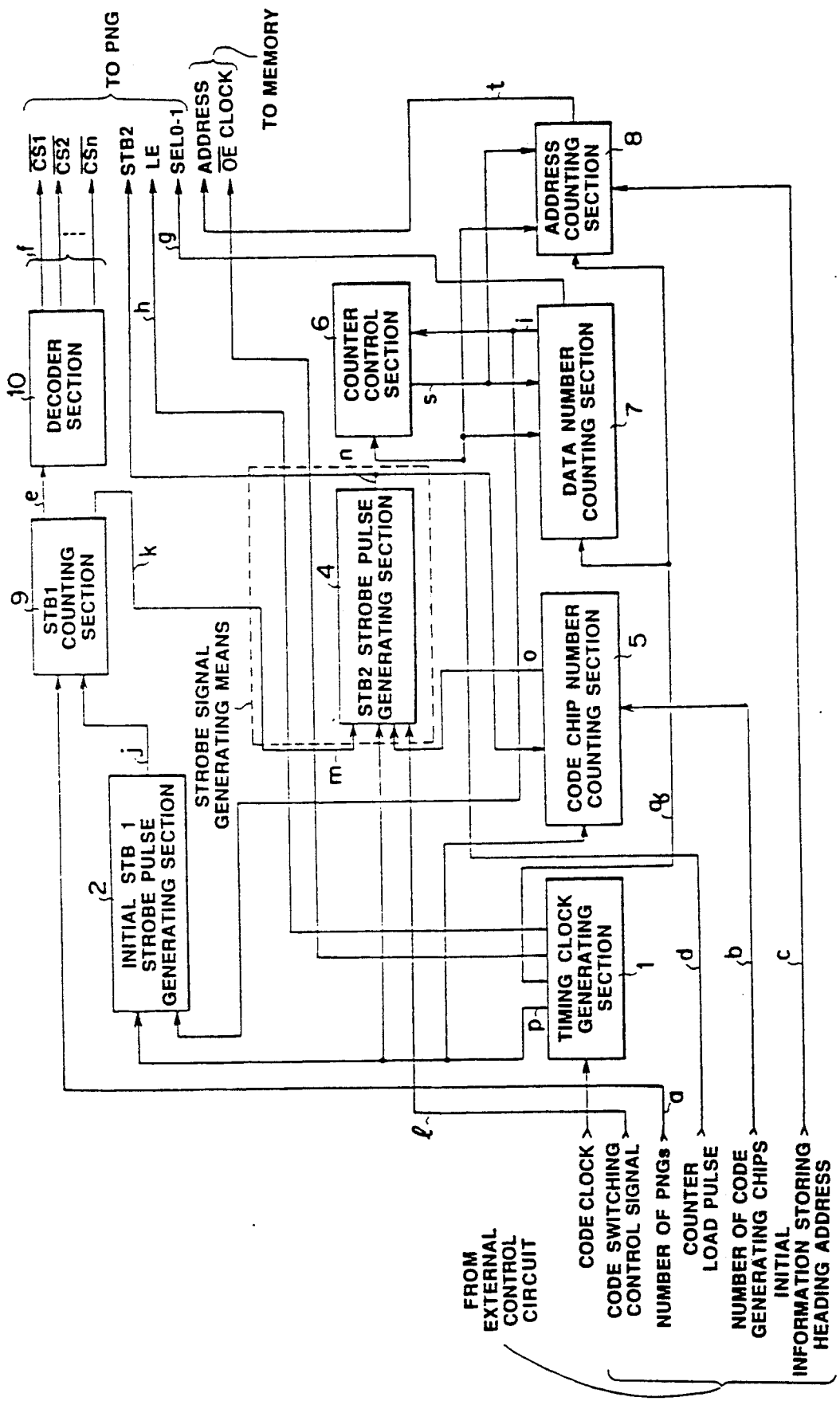
Figure 9:
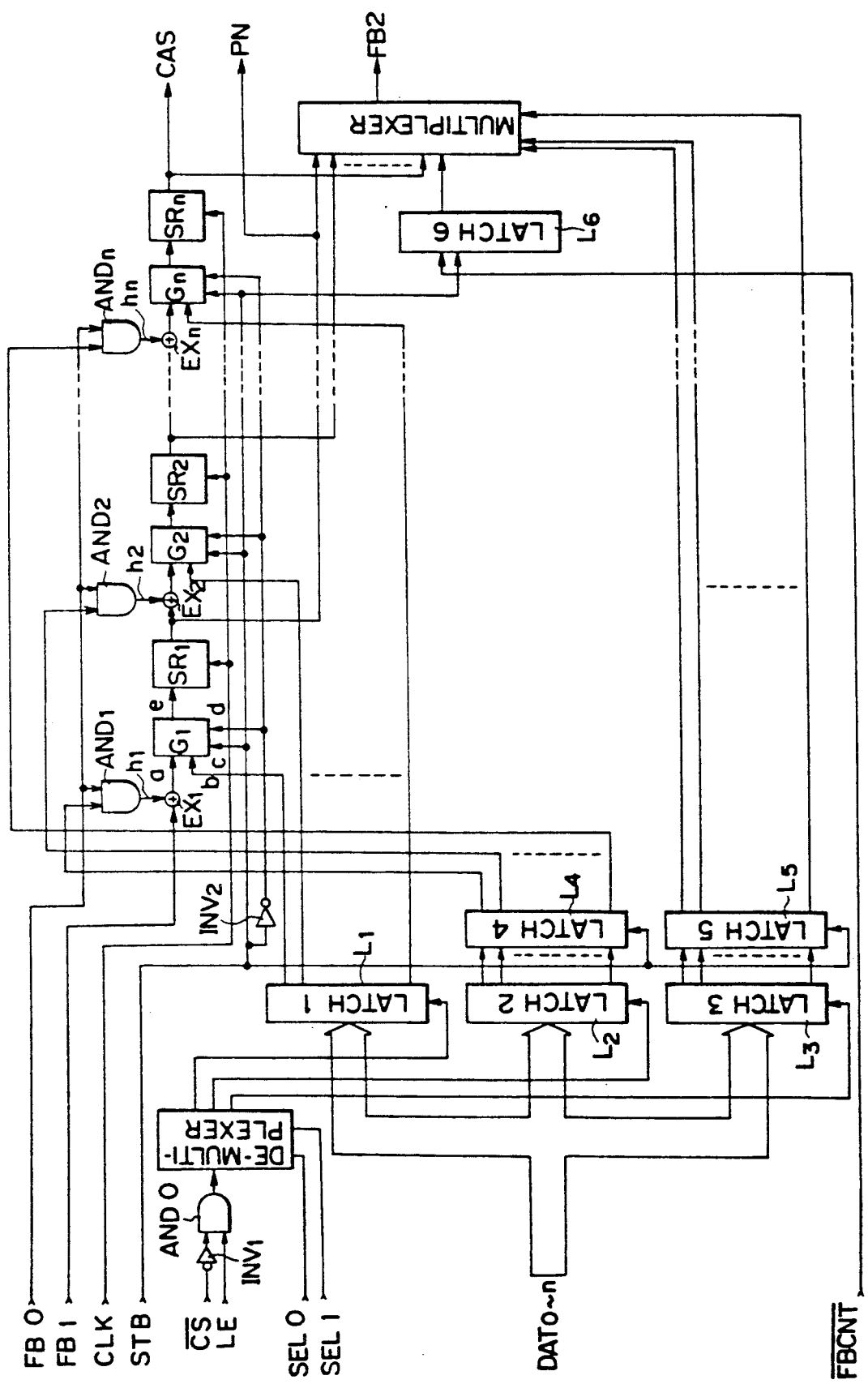
Figure 10:
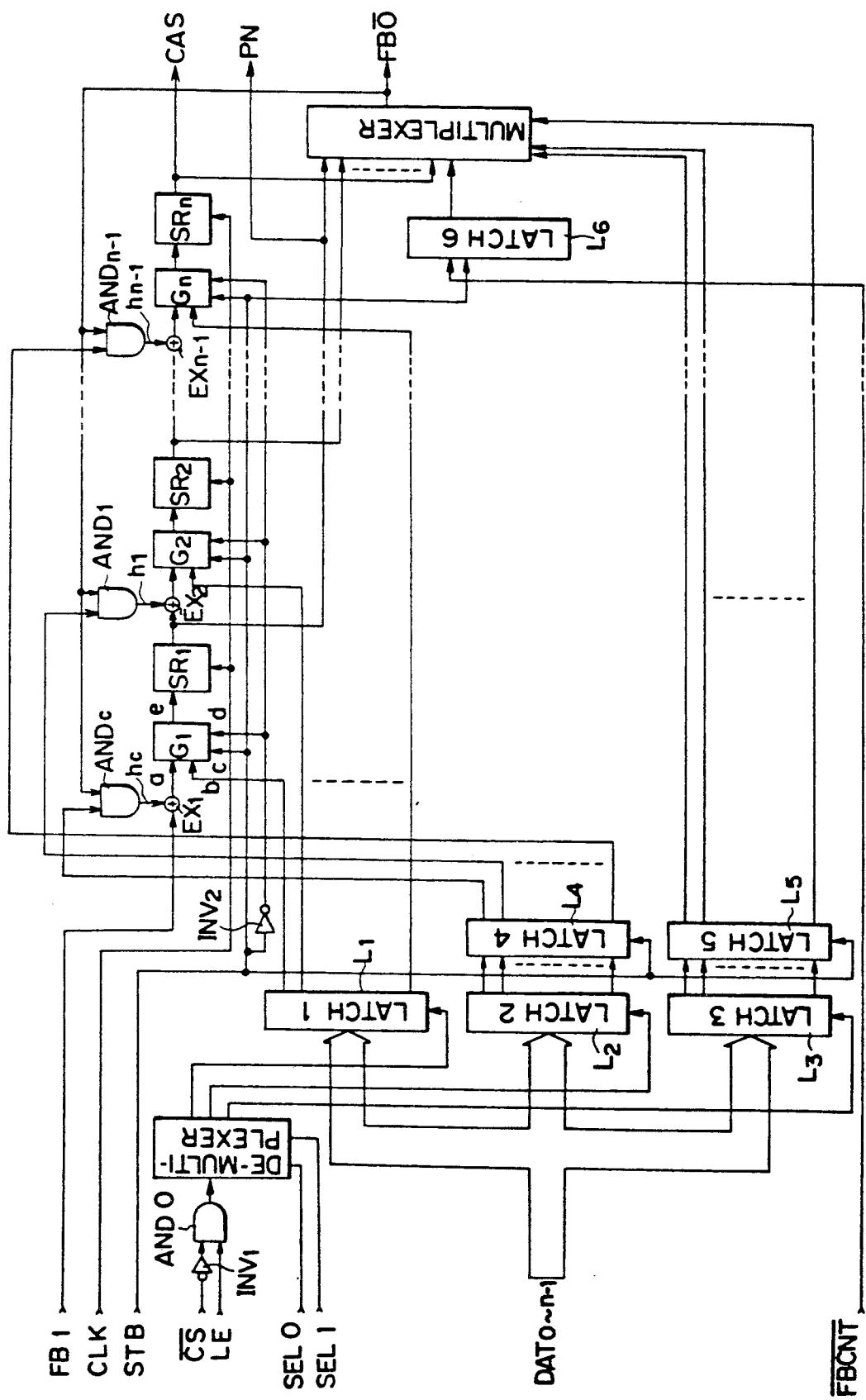

Further, as indicated in FIG. 7, the control device may input the code switching control signal (l) not in the STB1 control section 11, but in the strobe pulse generating section 4. In this case, the STB1 control section 11 outputs a trigger signal (m) to the strobe pulse generating section 4 on the basis of the strobe pulse STB1 (j) at that time. The strobe pulse generating section 4 outputs the strobe pulse STB2 (n) on the basis of the state of the code switching control signal (l) and the trigger signal (m). Still further, as indicated in FIG. 8, the STB1 control section 11 in FIG. 1 may be omitted and the code switching control signal (l) may be inputted in the strobe pulse generating section 4. In this case, the strobe pulse generating section 4 outputs the strobe pulse (n) on the basis of the trigger signal (k) outputted by the STB1 counting section 9 and the state of the code switching control signal (l).

Consequently, in the device indicated in FIG. 1, the external control circuit gives a counter load pulse LOAD, every time the initial strobe generating section 2 generates the strobe pulse STB1, until the strobe pulse generating section 4 generates the strobe pulse STB2 at first, and corrects the output, after having generated it the same number of times as the data (i) to (iii) have been set in the plurality of PNGs (number of PNGs).

The code chip number counting section 5 sends a code chip number count termination signal (o) to the strobe pulse generating section 4 after the count termination of the number of code chips (b) initially set, and the strobe pulse generating section 4 generates a new strobe pulse STB2 (n) by using the signal as a trigger (FIG. 4 <STEP D>).

Consequently, as indicated in FIGS. 2A, 2B and 2C, it is possible to obtain a code output having an arbitrary code length by using the strobe pulse STB2 (n).

Figure 5:
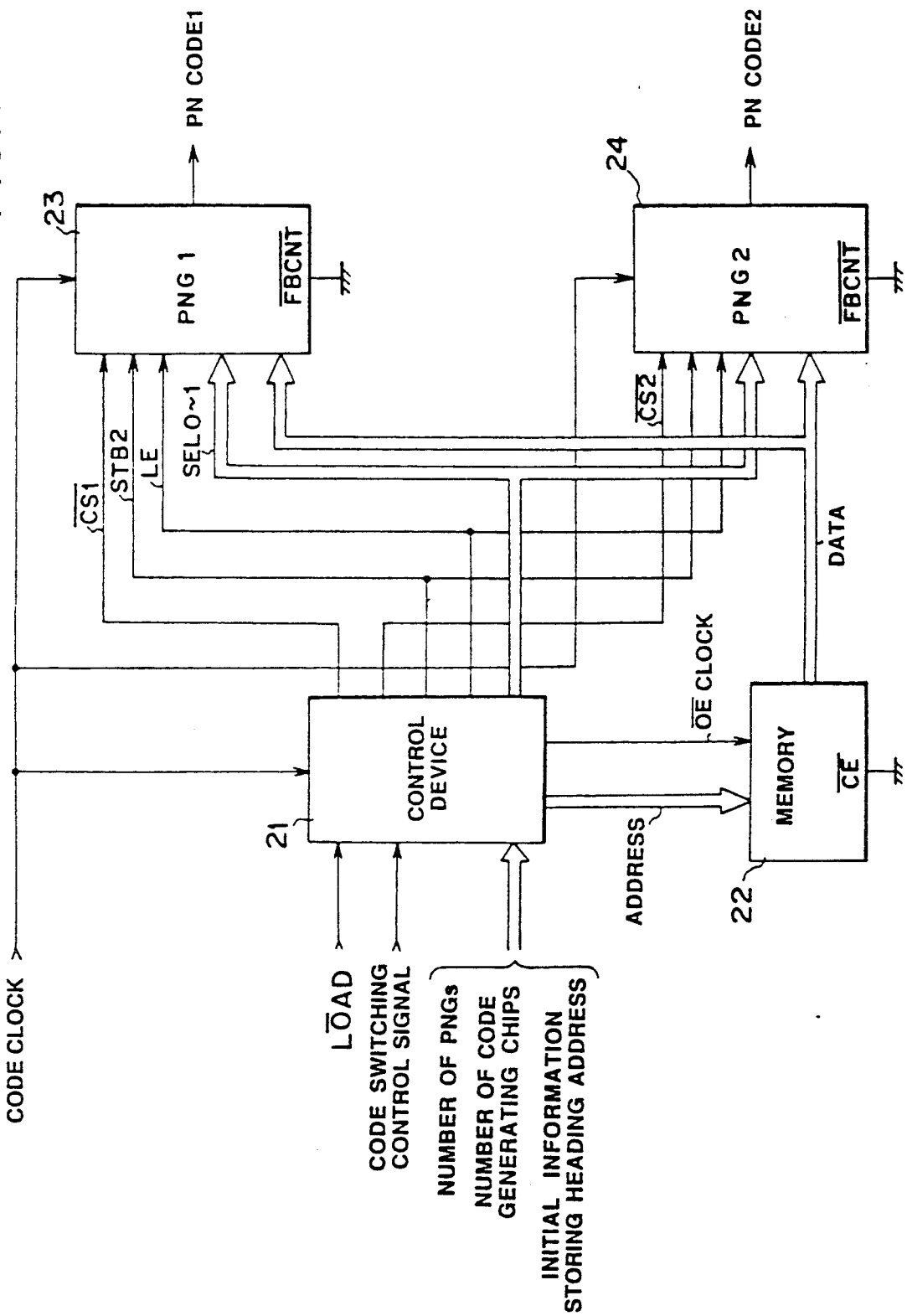
FIG. 5 shows a code generation control device, which is an embodiment of the present invention.
Figure 6:
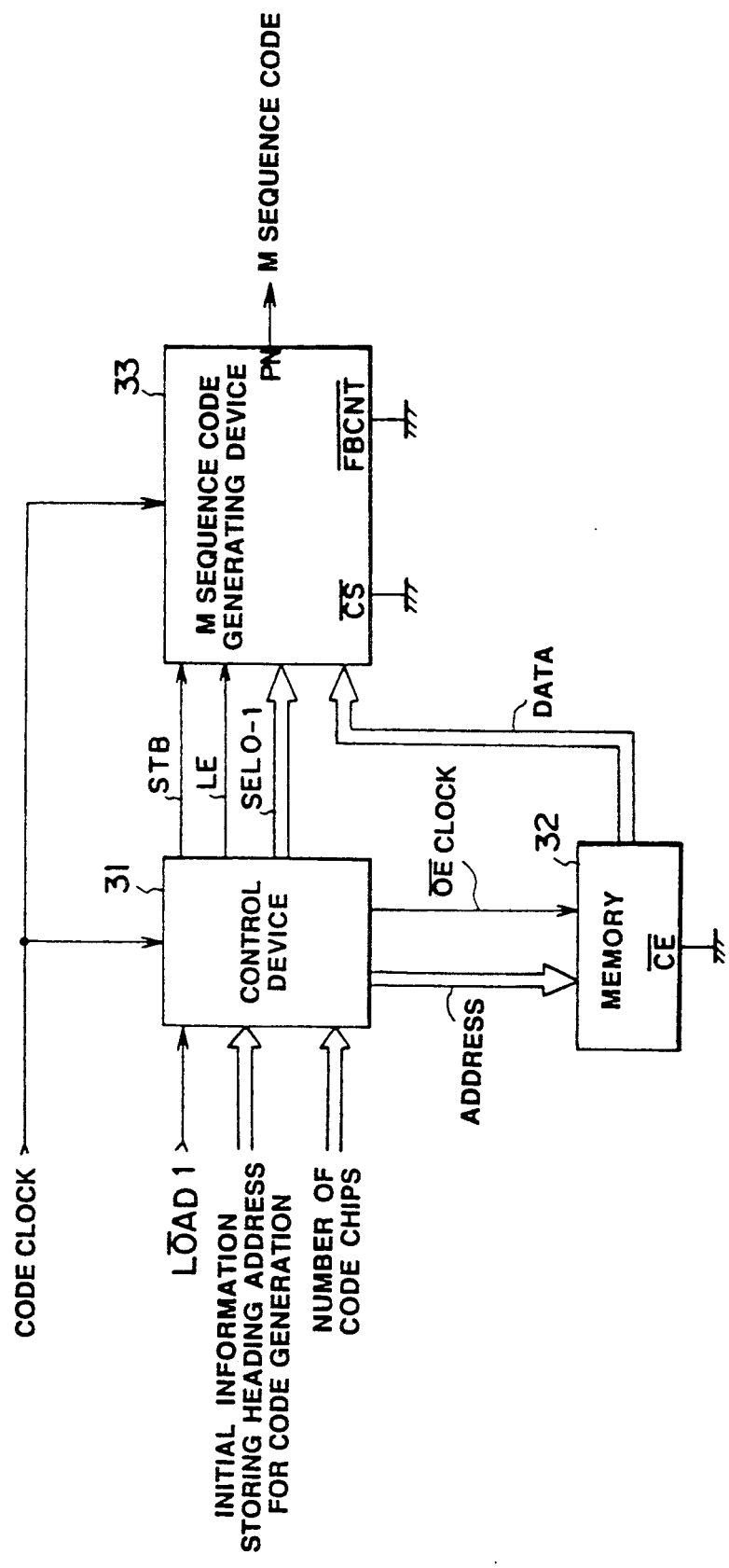
FIG. 6 is a block diagram indicating a prior art M sequence code generating device.

FIG. 5 shows the construction of an embodiment of the code generation control device according to the present invention.

In the figure, reference numeral 21 is a control device indicated in FIG. 1, 7 or 8; 22 is a memory; 22 and 23 are PNGs indicated e.g. in FIG. 3; $\overline{OE}$ clock represents an output enable clock; and $\overline{CE}$ represents a chip enable.

In the manner described previously, the heading address of the memory 22 and the number of PNGs 23 are set in the control device 21 by the external control circuit.

Further the initial information for generating an M sequence code generation is stored in the memory 22 and the initial information necessary for generating codes is set from this memory to the PNGs 23 by the control device 21.

Figure 11:
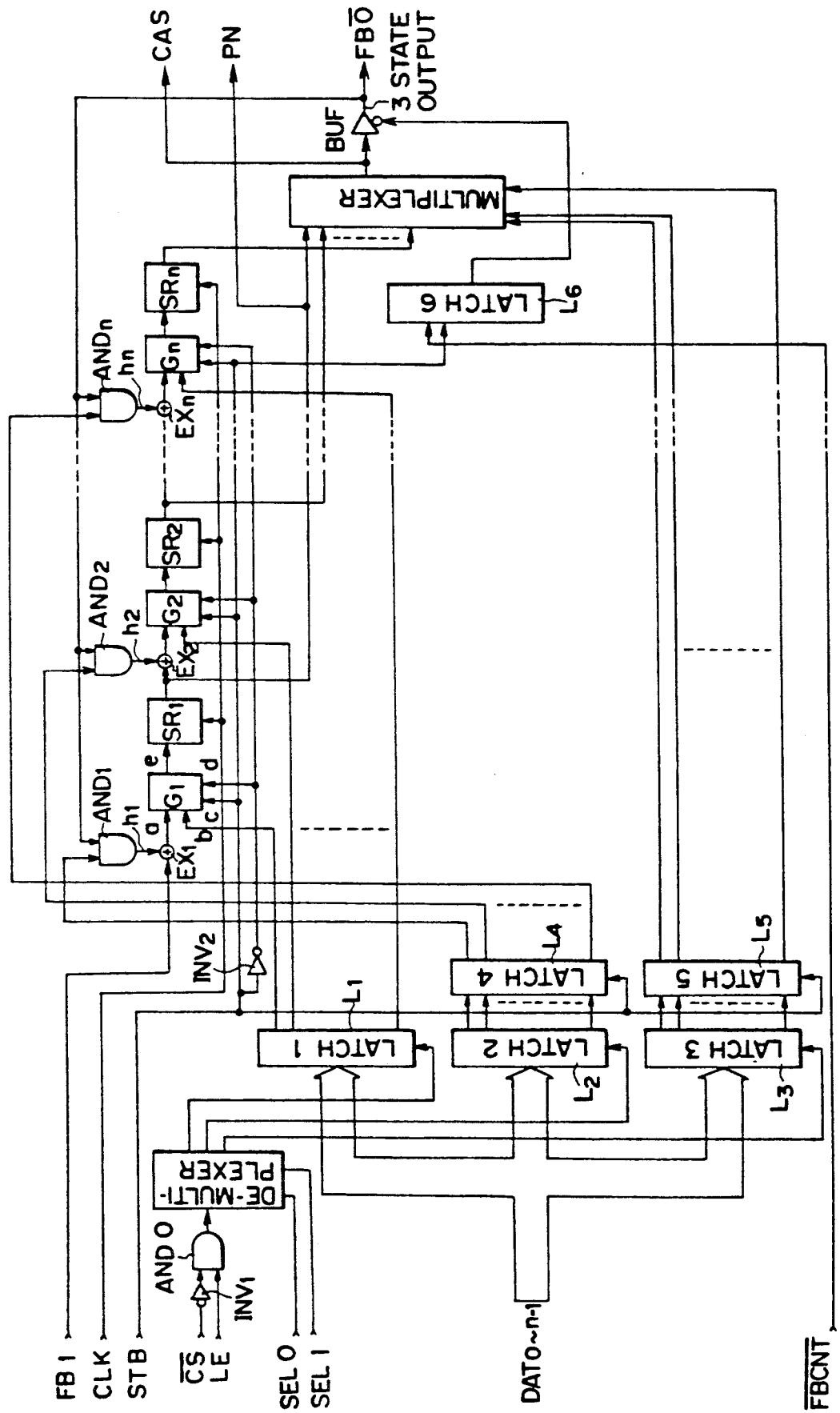
Figure 12:
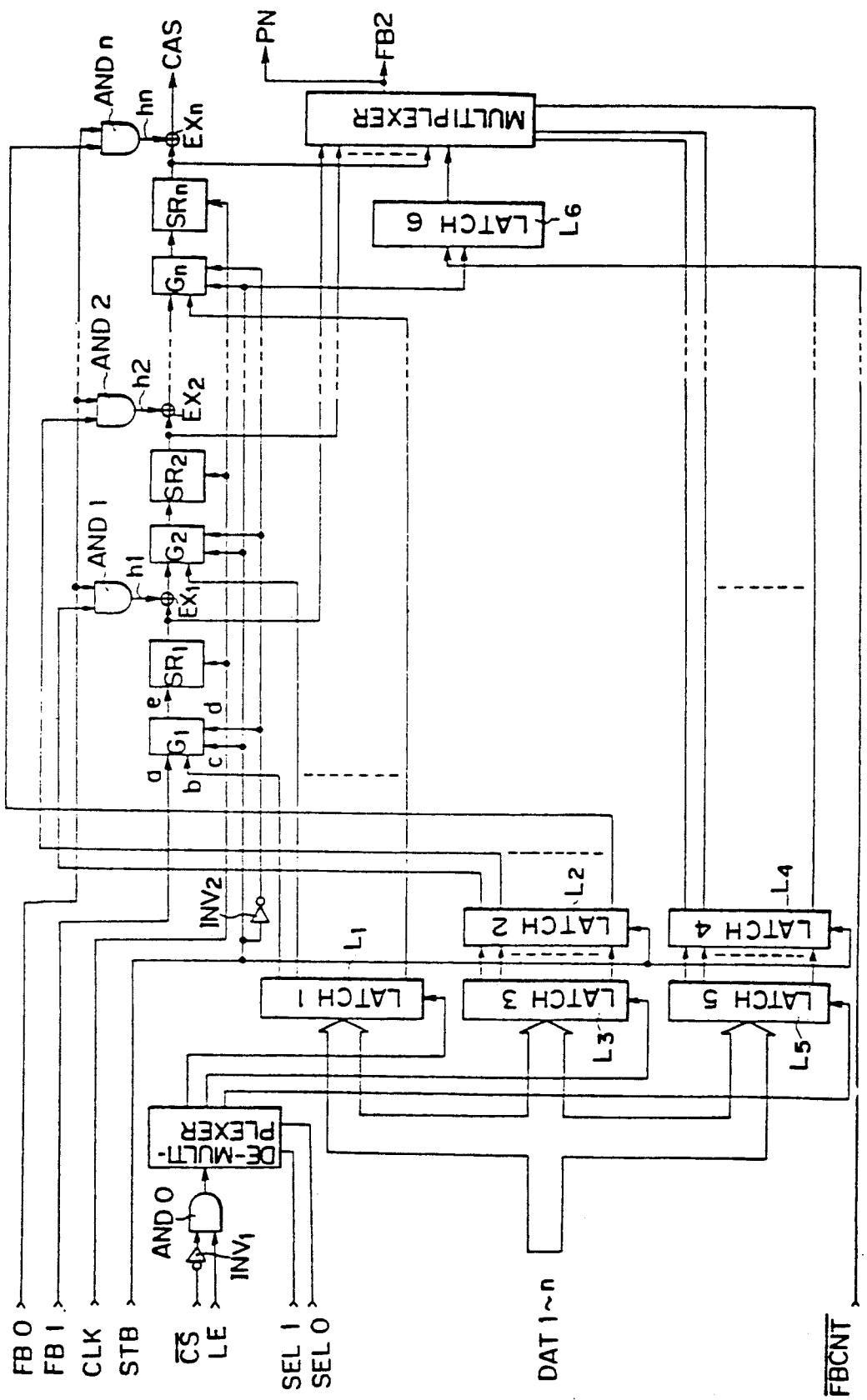

FIGS. 9 to 12 shows examples of other PNGs, which are objects of the present invention, in which the same reference numerals as those indicated in FIG. 3 represent identical or analogous circuits. In FIG. 11, BUF is a buffer of non-inverted type buffer and MPX' is a multiplexer generating an output, which is no 3-state output, but a usual output.

As explained above, according to the present invention, it is possible to obtain an M sequence code generation control device capable of setting the initial information for generating codes to a plurality of code generating devices with a high speed.

As an application, the control device according to present invention can be used as a control device for an M sequence code generating device, in which the sort and the phase of the M sequence codes both on the transmission and on the reception side can be arbitrarily varied in a spread spectrum communication system, where desired information is transmitted by using the correlation output between the M sequence code from the transmission side and the M sequence code generated on the reception side.

While particular embodiments of the invention have been shown and described, it will be obvious to those skilled in the art that various changes and modifications may be made without departing from the present invention in its broader aspect.

What is claimed is:

1. A code generation control device, which consists of a memory, in which initial information for generating an M sequence code is stored; a plurality of pseudo noise code generators; a control device for setting initial information necessary for generating codes from said memory to said plurality of pseudo noise code generators; and an external control circuit for setting the heading address of said memory and the number of said pseudo noise code generators; wherein said control device comprises;

a data number counting section, which counts the number of initial information sets for generating codes, when a clock signal is inputted therein, and outputs a termination signal on the basis of the termination of the data number counting;

an address counting section, which can specify an address in said memory on the basis of an inputted clock signal and set said heading address;

a counter control section, which puts said data number counting section and said address counting section in the enable state on the basis of a counter load signal from said external control circuit;

an initial strobe signal generating section for generating a first strobe signal on the basis of said termination signal;

a strobe signal counting section, in which a count value corresponding to the number of said pseudo noise code generators is set by said external control circuit, and which outputs said count value on the basis of said first strobe signal and at the same time outputs a trigger signal, when said count value reaches a predetermined value;

a decoder section, which decodes said count value of said strobe signal counting section and chip-selects one of said plurality of pseudo noise code generators; and a strobe signal generating means, which generates a second strobe signal to said plurality of pseudo noise code generators on the basis of said trigger signal.

2. A code generation control device according to claim 1 wherein said strobe signal generating section, in which a code switching control signal is inputted further from said external control circuit, generates said second strobe signal on the basis of the state of said code switching control signal, corresponding to the input of said trigger signal.

* * * * *